(12) United States Patent
Shuto

(10) Patent No.: US 7,266,023 B2
(45) Date of Patent: Sep. 4, 2007

(54) NONVOLATILE SEMICONDUCTOR MEMORY DEVICE WHICH READS BY DECREASING EFFECTIVE THRESHOLD VOLTAGE OF SELECTOR GATE TRANSISTOR

(75) Inventor: Susumu Shuto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 147 days.

(21) Appl. No.: 11/242,895

(22) Filed: Oct. 5, 2005

(65) Prior Publication Data
US 2007/0014182 A1    Jan. 18, 2007

(30) Foreign Application Priority Data
Jul. 14, 2005    (JP) .............................. 2005-205871

(51) Int. Cl.
*G11C 5/14*    (2006.01)
(52) U.S. Cl. .............................. 365/189.09; 365/189.11
(58) Field of Classification Search ........... 365/189.09, 365/189.11, 185.18, 185.33
See application file for complete search history.

(56) References Cited

U.S. PATENT DOCUMENTS

| 5,555,204 | A | | 9/1996 | Endoh et al. |
| 6,097,636 | A | * | 8/2000 | Nojima ................... 365/185.23 |
| 6,667,907 | B2 | * | 12/2003 | Chaya et al. .......... 365/185.18 |
| 6,771,544 | B2 | * | 8/2004 | Yoshida ................. 365/185.28 |

FOREIGN PATENT DOCUMENTS

JP    7-73688    3/1995

* cited by examiner

*Primary Examiner*—Vu A. Le
(74) *Attorney, Agent, or Firm*—Oblon, Spivak, McClelland, Maier & Neustadt, P.C.

(57) ABSTRACT

A semiconductor device includes memory cells and a driver. Each memory cell has a cell transistor which has one end of a current path connected to a bit line and stores data by storing charges in a floating gate, and a selector gate transistor which has one end of a current path connected to the other end of the current path of the cell transistor and the other end of the current path connected to a source line. The driver is configured to selectively drive the memory cells, and in read, apply, to a source line connected to a memory cell subjected to read, a potential of a sign opposite to that of a potential applied to the gate of the selector gate transistor in the memory cell to read.

20 Claims, 5 Drawing Sheets

NONVOLATILE SEMICONDUCTOR MEMORY DEVICE WHICH READS BY DECREASING EFFECTIVE THRESHOLD VOLTAGE OF SELECTOR GATE TRANSISTOR

CROSS-REFERENCE TO RELATED APPLICATIONS

This application is based upon and claims the benefit of priority from prior Japanese Patent Application No. 2005-205871, filed Jul. 14, 2005, the entire contents of which are incorporated herein by reference.

BACKGROUND OF THE INVENTION

1. Field of the Invention

The present invention relates to a semiconductor device having a memory cell which is made up of one FG (Floating Gate) transistor and one selector gate transistor and, more particularly, to a potential applied to a well region where a source line or memory cell is formed, in order to read by decreasing the effective threshold voltage of a selector gate transistor in data read in, e.g., a nonvolatile semiconductor memory device.

2. Description of the Related Art

As one kind of logic-embedded semiconductor memory device of which relatively high-speed read is required, there is proposed a nonvolatile semiconductor memory device having a memory cell which is made up of an FG transistor (cell transistor) and selector gate transistor. A memory cell of this type is described in, e.g., T. Ditewing et al., "An Embedded 1.2V-Read Flash Memory Module in a 0.18 µm Logic Process", 2001 IEEE ISSCC Digest 2.4, pp. 34-35, February/2001. In a memory cell described in this reference, the drain of an FG transistor is connected to a bit line, its source is connected to the drain of a selector gate transistor, and the source of the selector gate transistor is connected to a source line. A signal output from a word line driver is supplied to the control gate of the FG transistor and the gate of the selector gate transistor to drive these transistors.

As a nonvolatile semiconductor memory device having a similar memory cell structure, there is known a NAND flash memory disclosed in, e.g., Jpn. Pat. Appln. KOKAI Publication No. H07-073688. The memory cell of the NAND flash memory is made up of a plurality of FG transistors and two selector gate transistors. The current paths of the FG transistors are series-connected, and the selector gate transistors are respectively interposed between the bit line and the drain side of the series-connected FG transistors and between the source line and their source side.

Since no selector gate transistor exists on the drain side in the memory cell described in the above reference, the memory cell is not influenced by the channel resistance of the selector gate transistor on the drain side in read. Hence, the cell current can be set large to perform read quickly.

On the other hand, a potential applied to an unselected bit line in write must be stopped in the selector gate transistor on the source side so as not to supply any current from the unselected bit line to the source line. For this reason, a stricter leakage current characteristic is required of the selector gate transistor than a NAND transistor.

The leakage current of the selector gate transistor in write and the read speed of the memory cell have a tradeoff relationship because of the following reasons.

A conventional read method is executed by procedures (1) to (3).

(1) A bit line BL is precharged to, e.g., 0.9 V while 0 V is applied to all of a control gate CG of an FG transistor, a gate SG of a selector gate transistor, and a source line SL.

(2) After that, the gate SG of the selector gate transistor is set to a power supply voltage Vcc. If data stored in the memory cell is "1" (=positive threshold voltage Vth), no current flows, and the bit line BL is kept at 0.9 V. If data in the memory cell is "0" (=negative threshold voltage Vth), a current flows, and the potential of the bit line BL gradually drops from 0.9 V.

(3) After a predetermined wait time (time taken to sufficiently decrease the potential of the bit line BL for data "0"), a sense amplifier is operated to read the potential of the bit line BL and finalize read data.

At this time, the following problems may occur.

More specifically, the wait time until the sense amplifier is operated in read is determined by a memory cell current. As the memory cell current is larger, the potential of the bit line BL drops more quickly, and the wait time can be shortened. In other words, a quick-read memory can be implemented.

For this purpose, it is desirable that the threshold voltage of the selector gate transistor is low enough not to adversely influence the read current by the channel resistance of the selector gate transistor. When the threshold voltage of the selector gate transistor is high, the read current of the memory cell becomes large.

In this manner, a low threshold voltage of the selector gate transistor results in a high read speed. However, an excessively low voltage cannot prevent (leaks) punch-through generated by a write inhibit potential which is applied to the bit line in write, and a write error may occur.

In write, a write inhibit voltage of, e.g., 7 V is applied to the bit line BL in a voltage application state in which 20 V is applied to the control gate CG of the FG transistor, 0 V is applied to the gate SG of the selector gate transistor, and 0 V is applied to the source line SL. Since the 7-V voltage is applied between the bit line BL and the source line SL, the threshold voltage of the selector gate transistor must be high enough to stop punch-through generated by the applied voltage.

In particular, a write error is fatal to a semiconductor memory device, and the threshold voltage of the selector gate transistor must be so set as not to generate any write error. For this purpose, the read speed of the memory cell must be sacrificed, and thus the leakage current and read speed have a tradeoff relationship.

As described above, in a conventional semiconductor device, it is difficult to suppress the leakage current of the selector gate transistor small while ensuring a satisfactory read speed of the memory cell.

BRIEF SUMMARY OF THE INVENTION

According to an aspect of the present invention, there is provided a semiconductor device comprising a cell transistor which has one end of a current path connected to a bit line and stores data by storing charges in a floating gate, a selector gate transistor which has one end of a current path connected to the other end of the current path of the cell transistor and the other end of the current path connected to a source line, and forms a memory cell together with the cell transistor, and a driver configured to selectively drive the memory cell, and in read, apply, to a source line connected to a memory cell to read, a potential of a sign opposite to a sign of a potential applied to a gate of the selector gate transistor in the memory cell to read.

According to another aspect of the present invention, there is provided a semiconductor device comprising a cell transistor which has one end of a current path connected to a bit line and stores data by storing charges in a floating gate, a selector gate transistor which has one end of a current path connected to the other end of the current path of the cell transistor and the other end of the current path connected to a source line, and forms a memory cell together with the cell transistor, and a driver configured to selectively drive the memory cell, and in read, apply voltages which give opposite signs to a potential difference between a source line connected to a memory cell to read and a back gate of the cell transistor in the memory cell to read, and a potential difference between a gate of the selector gate transistor in the memory cell to read and the back gate of the selector gate transistor.

According to still another aspect of the present invention, there is provided a semiconductor device comprising a memory cell array in which memory cells are arrayed in a matrix, each of the memory cells comprising a cell transistor which has one end of a current path connected to a bit line and stores data by storing charges in a floating gate, and a selector gate transistor which has one end of a current path connected to the other end of the current path of the cell transistor and the other end of the current path connected to a source line, a word line driver configured to drive a word line in the memory cell array, a source line driver configured to drive a source line in the memory cell array, a sense amplifier configured to amplify a potential of a bit line in the memory cell array, a column decoder configured to select the sense amplifier, a negative voltage generation circuit configured to generate a negative voltage and apply the negative voltage to the source line driver, and a control circuit configured to control the word line driver and the source line driver, and in read, apply a negative voltage between a substrate and a source line connected to a memory cell to read.

According to still another aspect of the present invention, there is provided a semiconductor device comprising a memory cell array in which memory cells are arrayed in a matrix, each of the memory cells comprising a cell transistor which has one end of a current path connected to a bit line and stores data by storing charges in a floating gate, and a selector gate transistor which has one end of a current path connected to the other end of the current path of the cell transistor and the other end of the current path connected to a source line, a word line driver configured to drive a word line in the memory cell array, a source line driver configured to drive a source line in the memory cell array, a sense amplifier configured to amplify a potential of a bit line in the memory cell array, a column decoder configured to select the sense amplifier, a well potential application circuit configured to apply, to a well region where the selector gate transistor is formed, different potentials in accordance with operation of the memory cell, and a control circuit configured to control the well potential application circuit.

DETAILED DESCRIPTION OF THE INVENTION

First Embodiment

Figure 1:
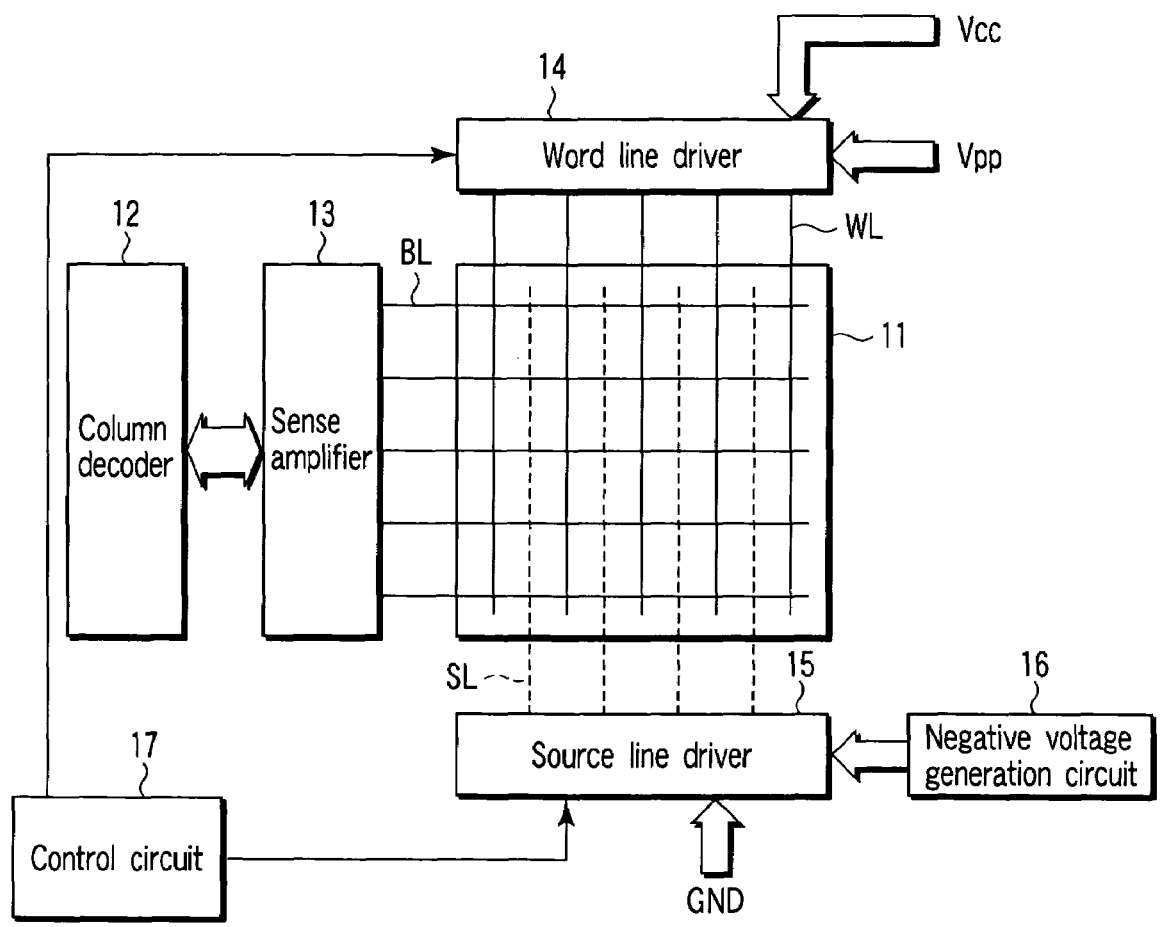
FIG. 1 is a block diagram showing a schematic arrangement by extracting a main part of a nonvolatile semiconductor memory device for explaining a semiconductor device according to the first embodiment of the present invention.

FIG. 1 is a block diagram showing a schematic arrangement by extracting a main part of a nonvolatile semiconductor memory device for explaining a semiconductor device according to the first embodiment of the present invention. The nonvolatile semiconductor memory device comprises a memory cell array 11, column decoder 12, sense amplifier 13, word line driver 14, source line driver 15, negative voltage generation circuit 16, and control circuit 17.

In the memory cell array 11, memory cells are arrayed in a matrix. To select each memory cell, its row is selected by the word line driver 14, and its column is selected by the column decoder 12. The word line driver 14 drives a word line WL, and the source line driver 15 applies a potential to a source line SL. The sense amplifier 13 amplifies the potential of a bit line BL.

The word line driver 14 receives a power supply voltage Vcc (e.g., 3.3 V) and a high voltage Vpp (e.g., 20 V) for programming. The source line driver 15 receives the ground potential GND, and a negative voltage of, e.g., −0.3 V output from the negative voltage generation circuit 16.

The word line driver 14 and source line driver 15 are controlled by the control circuit 17. The control circuit 17 controls the operations and output voltages of the word line driver 14 and source line driver 15 in accordance with read, write, erase, or the like. The drivers 14 and 15 selectively drive a memory cell MC, and in read, apply voltages which give opposite signs to the potential difference between the source line SL connected to a memory cell MC subjected to read and the back gate (SUB) of a cell transistor CT in the memory cell MC subjected to read, and the potential difference between the gate of a selector gate transistor ST in the memory cell MC subjected to read and the back gate of the selector gate transistor ST.

The source line driver 15 may be configured to apply a negative potential commonly to all memory cells in the memory cell array 11, or selectively apply a negative potential to only a source line SL connected to a memory cell subjected to read. When a negative potential is applied to only a source line SL connected to a memory cell subjected to read, for example, a selection circuit is arranged in the source line driver 15 to select the source line SL.

Figure 3:
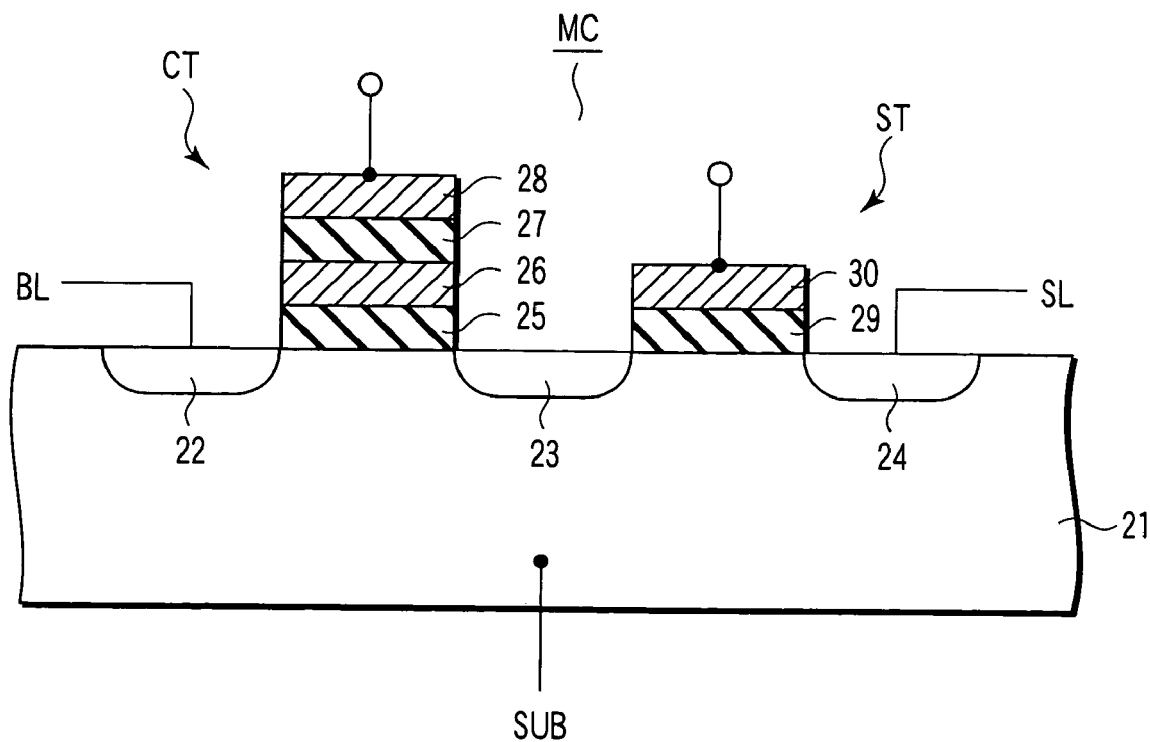
FIG. 3 is a sectional view showing the structure of the memory cell shown in FIG. 2.

FIG. 3 is a circuit diagram showing each memory cell in the memory cell array 11 in the circuit shown in FIG. 1. The memory cell MC is made up of one FG transistor (cell transistor) CT and one selector gate transistor ST. The drain of the cell transistor CT is connected to the bit line BL, and the control gate CG is connected to the word line driver 14. The drain of the selector gate transistor ST is connected to the source of the cell transistor CT. The source of the selector gate transistor ST is connected to the source line SL, and its gate is connected to the word line driver 14.

The word line driver 14 comprises a driver/decoder for the control gate CG of the cell transistor CT, and a driver/decoder the gate SG of the selector gate transistor ST. The two driver/decoders respectively control the control gate CG of the cell transistor CT and the gate SG of the selector gate transistor ST in accordance with read, write, erase, or the like.

Figure 2:
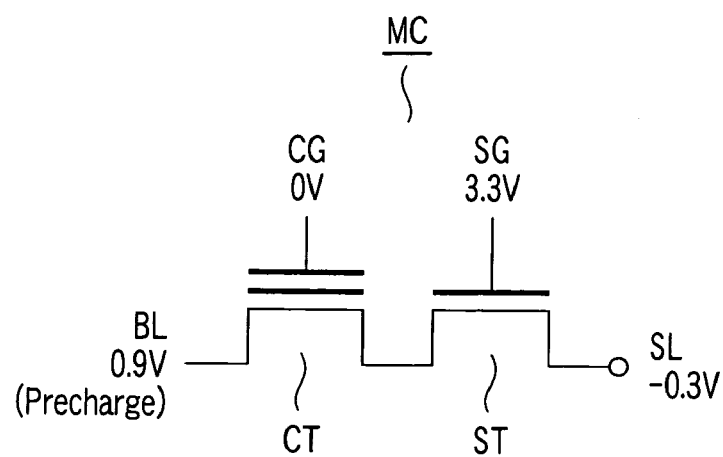
FIG. 2 is a circuit diagram showing a memory cell extracted from in a memory cell array in the circuit shown in FIG. 1.

FIG. 3 is a sectional view showing the structure of the memory cell MC shown in FIG. 2. An N-type impurity diffusion layer 22 serving as the drain of the cell transistor CT, an N-type impurity diffusion layer 23 serving as the source of the cell transistor CT and the drain of the selector gate transistor ST, and an N-type impurity diffusion layer 24 serving as the source of the selector gate transistor ST are formed on the major surface of a P-type semiconductor substrate (or P-well region) 21 so as to be isolated from each other. The diffusion layer 22 is connected to the bit line BL, and the diffusion layer 24 is connected to the source line SL.

A floating gate 26 is formed on a first gate insulating film 25 on the major surface of the substrate 21 between the N-type impurity diffusion layers 22 and 23. A control gate 28 (CG) is formed on a second gate insulating film 27 on the floating gate 26, thereby forming the cell transistor CT. The control gate 28 is connected to the driver/decoder for the control gate CG of the cell transistor CT.

A gate 30 (SG) is formed on a gate insulating film 29 on the major surface of the substrate 21 between the N-type impurity diffusion layers 23 and 24, thereby forming the selector gate transistor ST. The gate 30 is connected to the driver/decoder for the gate SG of the selector gate transistor ST.

Figure 4:
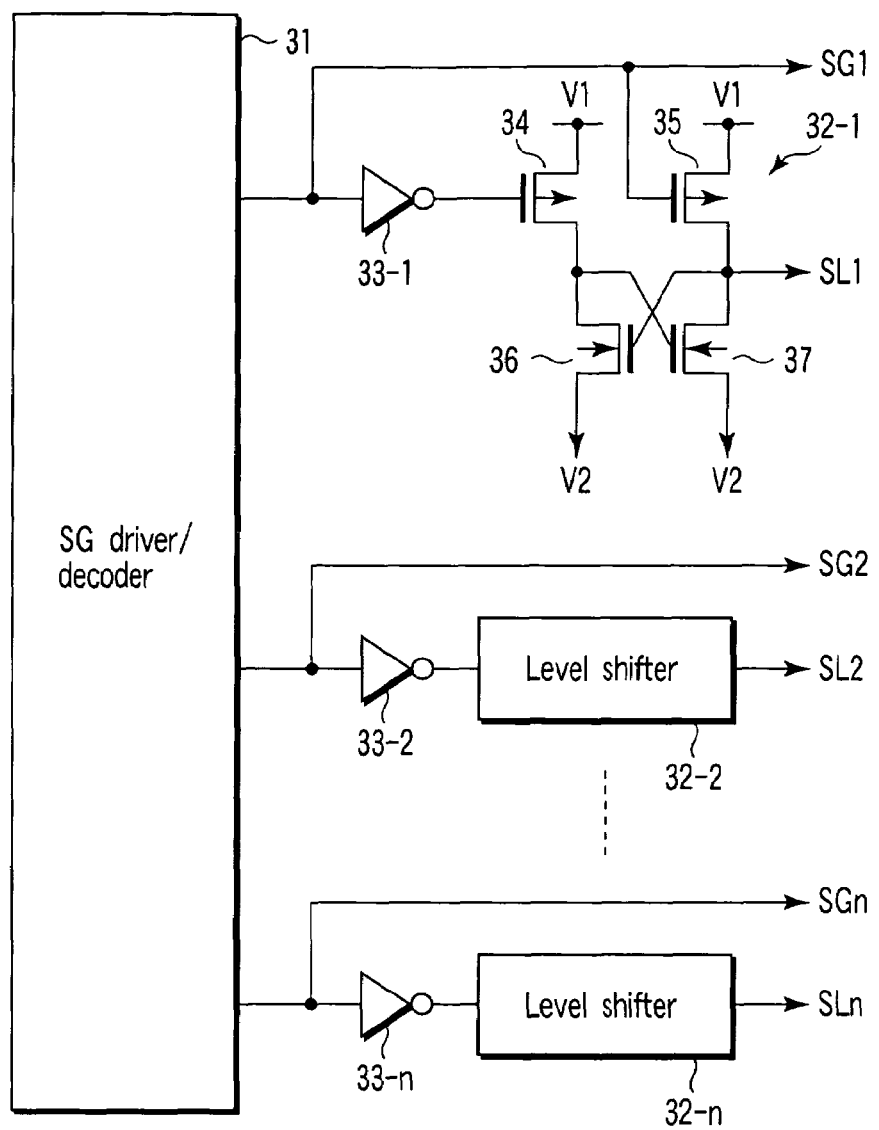
FIG. 4 is a circuit diagram showing the first arrangement example of a source line driver in the circuit shown in FIG. 1.

FIG. 4 shows the first arrangement example of the source line driver 15 in the circuit shown in FIG. 1. In the first arrangement example, the source line driver 15 is formed from a level shifter, and generates signals for driving source lines SL1, SL2, . . . , SLn by using signals SG1, SG2, . . . , SGn output from a driver/decoder 31 which is arranged in the word line driver 14 and used for the gate SG of the selector gate transistor ST.

The signals SG1, SG2, . . . , SGn output from the SG driver/decoder 31 are supplied to the gates of the selector gate transistors ST and also to level shifters 32-1, 32-2, . . . , 32-$n$ via inverters 33-1, 33-2, . . . , 33-$n$. The signals SL1, SL2, . . . , SLn level-shifted by the level shifters 32-1, 32-2, . . . , 32-$n$ drive the source lines SL.

As exemplified by the level shifter 32-1 at the initial stage, each of the level shifters 32-1, 32-2, . . . , 32-$n$ is formed from P-channel MOSFETs 34 and 35 and N-channel MOSFETs 36 and 37. The sources of the MOSFETs 34 and 35 are connected to a potential supply source V1 of, e.g., 3 V. The drains of the MOSFETs 34 and 35 are respectively connected to those of the MOSFETs 36 and 37, and the gates of the MOSFETs 36 and 37 are cross-coupled. The sources of the MOSFETs 36 and 37 are connected to a potential supply source V2 of, e.g., −0.3 V.

In the source line driver 15 which utilizes the signals SG1, SG2, . . . , SGn output from the SG driver/decoder 31, a voltage of 3 V is also applied to an unselected source line SL without any problem in operation. When the total current in read increases (owing to the leakage current of the source line SL) as a result of applying 3 V to the source line SL, the power supply voltages of the level shifters 32-1, 32-2, . . . , 32-$n$ are decreased from 3 V to, e.g., 2 V.

If signals input to the level shifters 32-1, 32-2, . . . , 32-$n$ are supplied not from the SG driver/decoder 31 but from a common signal line, −0.3 V can be supplied to all the source lines SL of the memory array 11 at once.

When the source lines SL are commonly set in the entire memory cell array 11, all the common source lines must be biased to a negative potential, and a large negative voltage generation circuit 16 having a sufficient current supply capacity is required. To the contrary, when a negative potential is applied to only a source line SL connected to a memory cell subjected to read, the drivability of the negative voltage generation circuit 16 suffices to be small, and an area occupied by the pattern of the negative voltage generation circuit 16 can be decreased. Either of the arrangements is selected in accordance with a necessary characteristic or requirement.

Operation in the above arrangement will be explained. The threshold voltage of the selector gate transistor ST in the memory cell MC is set to a level, e.g., about 1 V enough to prevent leakage. Read is executed by procedures (a) to (c) (see potentials in FIG. 2).

(a) The bit line BL is precharged to, e.g., 0.9 V while 0 V is applied to the control gate CG of the FG transistor CT, 0 V is applied to the gate SG of the selector gate transistor ST, and a positive bias, e.g. 1 V to 3 V is applied to the source line.

(b) After that, the gate SG of the selector gate transistor ST is set to the power supply voltage Vcc (e.g., 3.3 V), the source line is set to −0.3 V. If data stored in the memory cell is "1" (=positive threshold voltage Vth), no current flows, and the bit line BL is kept at 0.9 V. If data in the memory cell is "0" (=negative threshold voltage Vth), a current flows, and the potential of the bit line BL gradually drops from 0.9 V.

(c) After a predetermined wait time (time taken to sufficiently decrease the potential of the bit line BL for data "0"), the sense amplifier is operated to read the potential of the bit line BL and finalize read data.

When read is executed at these potential settings, a phenomenon opposite to a so-called substrate bias effect occurs, and the effective threshold voltage of the selector gate transistor ST can be decreased. Even if the threshold voltage of the selector gate transistor ST is so set as to suppress a leakage current enough to prevent a write error in write, the channel resistance of the selector gate transistor ST in read can be decreased to ensure a satisfactory cell current.

The first embodiment assumes that the cell transistor CT is an N-channel MOSFET. In this case, the source of the cell transistor CT is an N-type impurity diffusion layer, and the well region is of P type. If, therefore, a negative voltage equal to or higher than the flat band voltage of the P-N junction is applied (=forward bias), a large current flows through a source-well region path.

Since the flat band voltage between the source and the well region is generally about 0.7 V, a voltage applied to the source line SL in (a) must be higher than −0.7 V (=a voltage whose absolute value is small). If the absolute value of a negative potential applied to the source line SL is increased, a current which flows through a memory cell that stores "0"

data increases to increase the read speed. However, a current which flows through a path of the source line SL to the substrate increases. In a memory cell which stores "1" data, no current desirably flows in read. However, if the absolute value of the negative potential applied to the source line SL is excessively increased, a large current flows even in the memory cell which stores "1" data, failing in normal read.

To the contrary, if the absolute value of an applied negative potential is too small, the effects of the first embodiment cannot be fully obtained, and the read speed cannot be increased. Considering these factors, an appropriate source potential need to be selected, and, for example, −0.3 V is applied.

(Modification 1)

Figure 5:
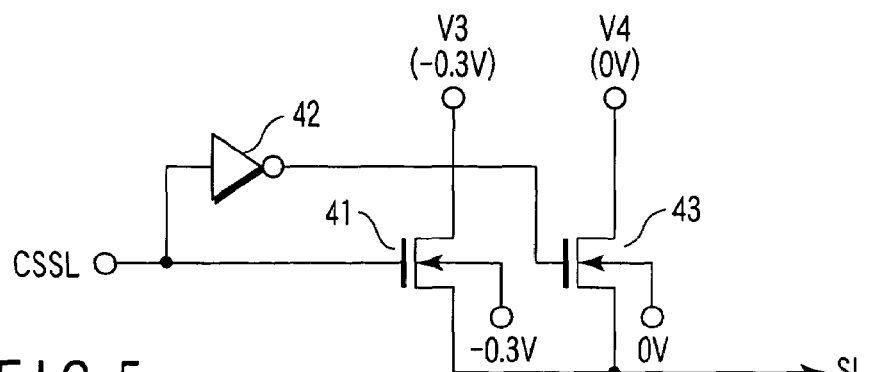
FIG. 5 is a circuit diagram for explaining the second arrangement example of the source line driver in the circuit shown in FIG. 1.

FIG. 5 is a circuit diagram for explaining the second arrangement example of the source line driver 15 in the circuit shown in FIG. 1 in which the potential of the source line SL is controlled with a switch. A control signal CSSL for controlling the potential of the source line SL is supplied to the gate of an N-channel MOSFET 41 serving as a switch. The control signal CSSL is also supplied via an inverter 42 to the gate of an N-channel MOSFET 43 serving as a switch.

The source of the MOSFET 41 is connected to a potential supply source V3 of −0.3 V, and its drain is connected to the source line SL. A voltage of −0.3 V is applied to the back gate of the MOSFET 41, in other words, a well region where the MOSFET 41 is formed.

The source of the MOSFET 43 is connected to a potential supply source V4 of 0 V, and its drain is connected to the source line SL. A voltage of 0 V is applied to the back gate of the MOSFET 43, in other words, a well region where the MOSFET 43 is formed.

In this arrangement, when the signals SG1, SG2, ..., SGn output from the SG driver/decoder 31 shown in FIG. 4 are used as the control signal CSSL, a voltage of −0.3 V can be selectively applied to only a source line SL connected to a memory cell subjected to read.

When the control signal CSSL is supplied from a common signal line, the source line driver 15 applies −0.3 V to all the source lines SL of the memory array 11 at once.

(Modification 2)

Figure 6:
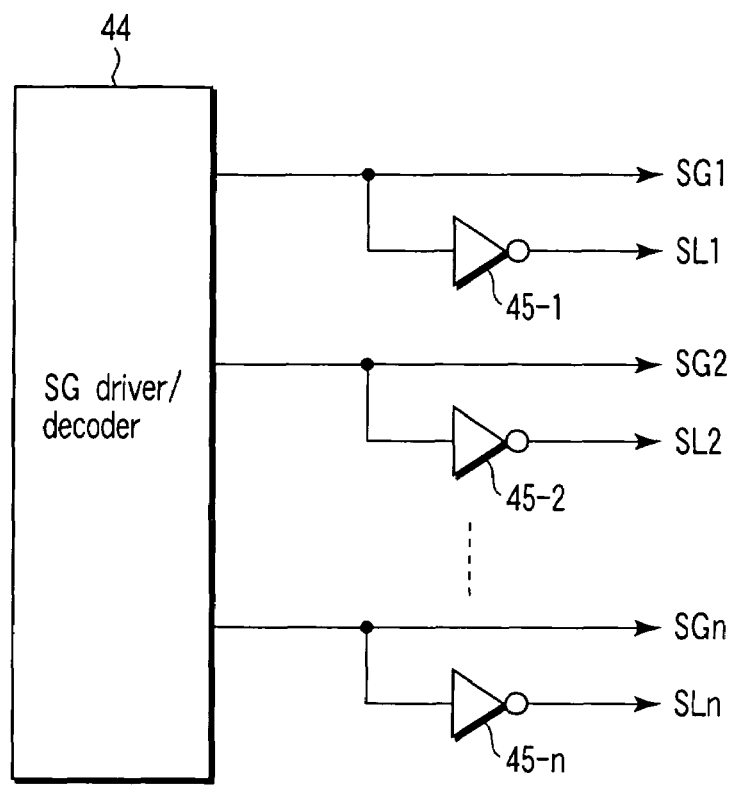
FIG. 6 is a circuit diagram showing the third arrangement example of a source line driver/decoder in the circuit shown in FIG. 1.

FIG. 6 shows the third arrangement example of the source line driver 15 in the circuit shown in FIG. 1. In this example, the source line driver 15 employs an SG driver/decoder 44 which outputs signals SG1, SG2, ..., SGn whose "H" level is Vcc level and "L" level is −0.3 V. The driver/decoder 44 operates upon application of "Vcc−0.3 V" and "GND−0.3 V" as power supply voltages. A voltage of −0.3 V is applied to a P-well region where an N-channel MOSFET which forms the SG driver/decoder 44 is formed.

The signals SG1, SG2, ..., SGn output from the driver/decoder 44 are supplied to the gates SG of the selector gate transistors ST, and also supplied to inverters 45-1, 45-2, ..., 45-n to generate signals for driving the source lines SL1, SL2, ..., SLn.

Figure 7:
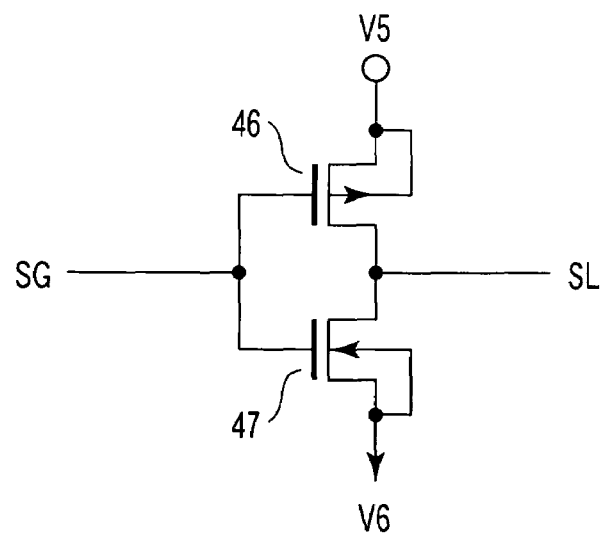
FIG. 7 is a circuit diagram showing an arrangement example of an inverter in the circuit shown in FIG. 6.

As shown in FIG. 7, each of the inverters 45-1, 45-2, ..., 45-n has a CMOS structure, and is made up of a P-channel MOSFET 46 and N-channel MOSFET 47. The source and back gate of the MOSFET 46 are connected to a potential supply source V5 of about 2 V to (Vcc−0.3 V), and those of the MOSFET 47 are connected to a potential supply source V6 of −0.3 V. A signal SG (SG1, SG2, ..., SGn) output from the SG driver/decoder 44 is supplied to the gates of the MOSFETs 46 and 47, and a signal for driving the source line SL is output from the common connection point between the drains of the MOSFETs 46 and 47.

If signals input to the inverters 45-1, 45-2, ..., 45-n are supplied not from the SG driver/decoder 44 but from a common signal line, −0.3 V can be applied to all the source lines SL of the memory array 11 at once.

When the source lines SL are commonly set in the entire memory cell array 11, all the common source lines must be biased to a negative potential, and a large negative voltage generation circuit 16 having a sufficient current supply capacity is required. To the contrary, when a negative potential is applied to only a source line connected to a memory cell subjected to read, the drivability of the negative voltage generation circuit 16 suffices to be small, and an area occupied by the pattern of the negative voltage generation circuit 16 can be decreased. Either of the arrangements is selected in accordance with a necessary characteristic or requirement.

Second Embodiment

Figure 8:
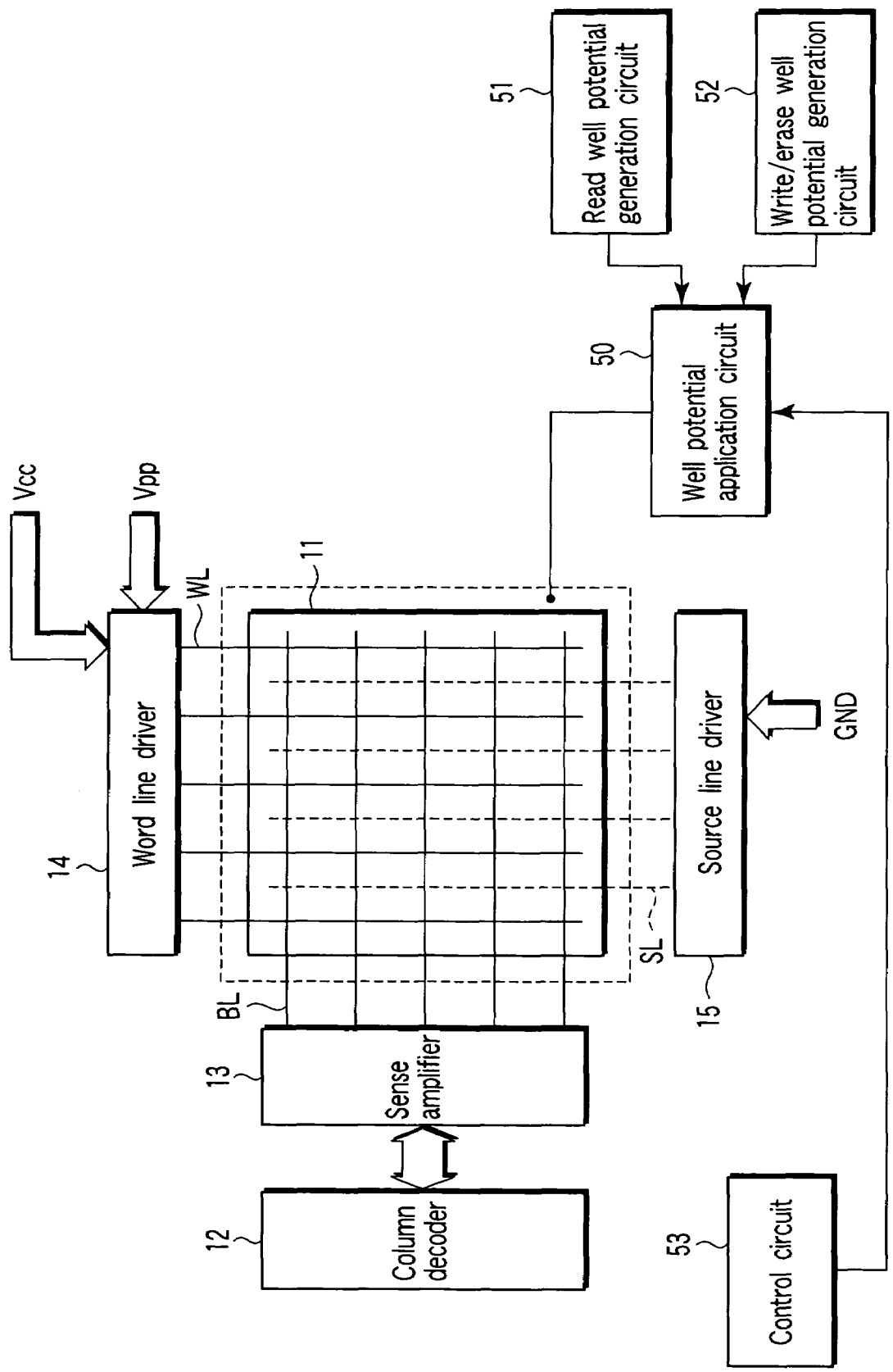
FIG. 8 is a block diagram showing a schematic arrangement by extracting a main part of a nonvolatile semiconductor memory device for explaining a semiconductor device according to the second embodiment of the present invention.

FIG. 8 is a block diagram showing a schematic arrangement by extracting a main part of a nonvolatile semiconductor memory device for explaining a semiconductor device according to the second embodiment of the present invention. The nonvolatile semiconductor memory device comprises a memory cell array 11, column decoder 12, sense amplifier 13, word line driver 14, source line driver 15, well potential application circuit 50, read well potential generation circuit 51, write/erase well potential generation circuit 52, and control circuit 53. The circuits 50, 51, 52, and 53 apply a potential to a P-well region where a cell transistor CT and selector gate transistor ST in the memory cell array 11 are formed, and these circuits function as part of a driver for selectively driving a memory cell.

In the memory cell array 11, memory cells are arrayed in a matrix. To select each memory cell, its row is selected by the word line driver 14, and its column is selected by the column decoder 12. The word line driver 14 drives a word line WL, and the source line driver 15 applies a potential to a source line SL. The sense amplifier 13 amplifies the potential of a bit line BL.

The word line driver 14 receives a power supply voltage Vcc and a high voltage Vpp for programming, and the source line driver 15 receives the ground potential GND.

The well potential application circuit 50 receives a potential output from the read well potential generation circuit 51 and a potential output from the write/erase well potential generation circuit 52. The well potential application circuit 50 is controlled by the control circuit 53. In accordance with read or write/erase with respect to the memory cell array 11, the well potential application circuit 50 selectively applies a potential output from the read well potential generation circuit 51 or a potential output from the write/erase well potential generation circuit 52 to a P-well region where the cell transistor CT and selector gate transistor ST of the memory cell array 11 are formed.

Similar to the first embodiment, the second embodiment assumes that the cell transistor CT is an N-channel MOSFET. Also, similar to the first embodiment, the threshold voltage of the selector gate transistor ST is set high enough to suppress a leakage current to a negligible degree in write. In read, a positive potential of about 0.3 V is applied to the well region (=substrate). The potential settings of the remaining terminals are basically equal to conventional ones, but it is desirable to slightly increase the drain voltage from a conventional one. When 0.9 V is applied in the prior art, 0.3 V is added to apply about 1.2 V.

This arrangement selectively drives a memory cell MC, and in read, applies voltages which give opposite signs to the potential difference between the source line SL connected to a memory cell MC subjected to read and the back gate of a cell transistor CT in the memory cell MC subjected to read, and the potential difference between the gate of a selector gate transistor ST in the memory cell MC subjected to read and the back gate of the selector gate transistor ST. Consequently, substantially the same operation effects as those of the first embodiment can be obtained. The first embodiment requires the negative voltage generation circuit 16, but the second embodiment does not require any negative voltage generation circuit. The circuit configuration can, therefore, be simplified to decrease the chip area, compared to the first embodiment.

As described above, by applying a negative potential to the source line SL or a positive potential of about 0.3 V to the well region (=substrate) in read, the effective threshold voltage of the selector gate transistor can be decreased to increase the read current and read speed. While a leakage current enough to satisfactorily prevent a write error is realized in write, the channel resistance of the selector gate transistor in read can be reduced to obtain a sufficient cell current.

As described above, according to one aspect of this invention, a semiconductor device having a satisfactory read speed while preventing any write error can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a cell transistor which has one end of a current path connected to a bit line and stores data by storing charges in a floating gate;
   a selector gate transistor which has one end of a current path connected to the other end of the current path of the cell transistor and the other end of the current path connected to a source line, and forms a memory cell together with the cell transistor; and
   a driver which selectively drives the memory cell, and which applies in read, to a source line connected to a memory cell to read, a potential of a sign opposite to a sign of a potential applied to a gate of the selector gate transistor in the memory cell to read.

2. A device according to claim 1, wherein the driver comprises a word line driver which drives the cell transistor and the selector gate transistor, a source line driver which applies a potential to the source line, and a negative voltage generation circuit which generates a negative voltage and applies the negative voltage to the source line driver.

3. A device according to claim 2, further comprising a control circuit configured to control the word line driver and the source line driver.

4. A device according to claim 1, further comprising a selection circuit configured to select a source line connected to a memory cell to read.

5. A device according to claim 2, wherein the word line driver comprises a first driver/decoder for driving a control gate of the cell transistor and a second driver/decoder for driving the gate of the selector gate transistor.

6. A device according to claim 2, wherein
   the word line driver further comprises a first driver/decoder for driving a control gate of the cell transistor, a second driver/decoder for driving the gate of the selector gate transistor, and a selection circuit configured to select a source line connected to a memory cell to read, and
   the selection circuit includes a level shifter which shifts a level of a signal output from the second driver/decoder.

7. A device according to claim 2, wherein
   the word line driver further comprises a first driver/decoder for driving a control gate of the cell transistor, a second driver/decoder for driving the gate of the selector gate transistor, and a selection circuit configured to select a source line connected to a memory cell to read, and
   the selection circuit includes a first switch which operates in response to a signal output from the second driver/decoder and applies a negative potential to the source line, and a second switch which operates in response to a signal output from the second driver/decoder and applies a ground potential to the source line.

8. A device according to claim 2, wherein
   the word line driver comprises a first driver/decoder for driving a control gate of the cell transistor, a second driver/decoder for driving the gate of the selector gate transistor, and a selection circuit configured to select a source line connected to a memory cell to read, and
   the selection circuit comprises an inverter which receives a signal output from the second driver/decoder.

9. A device according to claim 1, wherein the cell transistor and the selector gate transistor are of N-channel type, and a potential applied from the driver to the source line in read is negative.

10. A semiconductor device comprising:
    a cell transistor which has one end of a current path connected to a bit line and stores data by storing charges in a floating gate;
    a selector gate transistor which has one end of a current path connected to the other end of the current path of the cell transistor and the other end of the current path connected to a source line, and forms a memory cell together with the cell transistor; and
    a driver configured to selectively drive the memory cell, and in read, apply voltages which give opposite signs to a potential difference between a source line connected to a memory cell to read and a back gate of the cell transistor in the memory cell to read, and a potential difference between a gate of the selector gate transistor in the memory cell to read and the back gate of the selector gate transistor.

11. A device according to claim 10, wherein the driver comprises a word line driver which drives the cell transistor and the selector gate transistor, a source line driver which applies a potential to the source line, a well potential application circuit which applies, to a well region where the selector gate transistor is formed, different potentials in accordance with operation of the memory cell, a first well potential generation circuit which generates a read well potential and applies the read well potential to the well potential application circuit, and a second well potential generation circuit which generates a write/erase well potential and applies the write/erase well potential to the well potential application circuit.

12. A device according to claim 11, further comprising a control circuit configured to control the well potential application circuit to selectively apply, to the well region where the selector gate transistor is formed, a potential output from the first well potential generation circuit or a potential output from the second well potential generation circuit.

13. A device according to claim 10, further comprising a selection circuit configured to select a source line connected to a memory cell to read.

14. A device according to claim 11, wherein the cell transistor and the selector gate transistor are of N-channel type, a potential applied from the source line driver to the source line in read is a ground potential, and a potential applied from the well potential application circuit to the well region where the selector gate transistor is formed is positive.

15. A semiconductor device comprising:
a memory cell array in which memory cells are arrayed in a matrix, each of the memory cells comprising a cell transistor which has one end of a current path connected to a bit line and stores data by storing charges in a floating gate, and a selector gate transistor which has one end of a current path connected to the other end of the current path of the cell transistor and the other end of the current path connected to a source line;
a word line driver configured to drive a word line in the memory cell array;
a source line driver configured to drive a source line in the memory cell array;
a sense amplifier configured to amplify a potential of a bit line in the memory cell array;
a column decoder configured to select the sense amplifier;
a negative voltage generation circuit configured to generate a negative voltage and apply the negative voltage to the source line driver; and
a control circuit configured to control the word line driver and the source line driver, and in read, apply a negative voltage between a substrate and a source line connected to a memory cell to read.

16. A device according to claim 15, wherein
the word line driver comprises a first driver/decoder for driving a control gate of the cell transistor and a second driver/decoder for driving the gate of the selector gate transistor, and
the source line driver drives the source line on the basis of a signal output from the second driver/decoder.

17. A device according to claim 15, wherein the cell transistor and the selector gate transistor are of N-channel type, and the negative voltage generated by the negative voltage generation circuit is applied from the source line driver to the source line in read.

18. A semiconductor device comprising:
a memory cell array in which memory cells are arrayed in a matrix, each of the memory cells comprising a cell transistor which has one end of a current path connected to a bit line and stores data by storing charges in a floating gate, and a selector gate transistor which has one end of a current path connected to the other end of the current path of the cell transistor and the other end of the current path connected to a source line;
a word line driver configured to drive a word line in the memory cell array;
a source line driver configured to drive a source line in the memory cell array;
a sense amplifier configured to amplify a potential of a bit line in the memory cell array;
a column decoder configured to select the sense amplifier;
a well potential application circuit configured to apply, to a well region where the selector gate transistor is formed, different potentials in accordance with operation of the memory cell; and
a control circuit configured to control the well potential application circuit.

19. A device according to claim 18, which further comprises a first well potential generation circuit which generates a read well potential and applies the read well potential to the well potential application circuit, and a second well potential generation circuit which generates a write/erase well potential and applies the write/erase well potential to the well potential application circuit, and in which the well potential application circuit selectively applies, to the well region where the selector gate transistor is formed, a voltage output from the first well potential generation circuit or a voltage output from the second well potential generation circuit.

20. A device according to claim 18, wherein the cell transistor and the selector gate transistor are of N-channel type, a potential applied from the source line driver to the source line in read is a ground potential, and a potential applied from the well potential application circuit to the well region where the selector gate transistor is formed is positive.

* * * * *